United States Patent
Kumar et al.

(10) Patent No.: US 6,696,365 B2
(45) Date of Patent: Feb. 24, 2004

(54) PROCESS FOR IN-SITU ETCHING A HARDMASK STACK

(75) Inventors: Ajay Kumar, Sunnyvale, CA (US); Anisul Khan, Santa Clara, CA (US); Sanjay Thekdi, Santa Clara, CA (US); Dragan V. Podlesnik, Palo Alto, CA (US)

(73) Assignee: Applied Materials, Inc., Santa Clara, CA (US)

( * ) Notice: Subject to any disclaimer, the term of this patent is extended or adjusted under 35 U.S.C. 154(b) by 209 days.

(21) Appl. No.: 10/041,540

(22) Filed: Jan. 7, 2002

(65) Prior Publication Data

US 2003/0129840 A1 Jul. 10, 2003

(51) Int. Cl.[7] .............................................. H01L 21/302
(52) U.S. Cl. ........................ 438/706; 438/709; 438/717; 438/719; 438/723; 438/724; 438/725
(58) Field of Search .................... 438/706, 709, 438/717, 719, 723, 724, 725

(56) References Cited

U.S. PATENT DOCUMENTS 6,103,632 A * 8/2000 Kumar et al. ............... 438/717
6,335,235 B1 * 1/2002 Bhakta et al. ............... 438/221
6,498,383 B2 * 12/2002 Beyer et al. ................. 257/510
6,528,384 B2 * 3/2003 Beckmann et al. .......... 438/386
6,541,382 B1 * 4/2003 Cheng et al. ................ 438/692

* cited by examiner

Primary Examiner—Nadine G. Norton
Assistant Examiner—Binh X. Tran
(74) Attorney, Agent, or Firm—Birgit Morris; Joseph Bach

(57) ABSTRACT

A method of etching high aspect ratio, anisotropic deep trench openings in a silicon substrate coated with a multi-layer mask comprising in sequence a pad oxide layer, a silicon nitride layer, a doped or undoped silicon oxide hard mask layer, a polysilicon hard mask layer, an antireflection coating and a patterned photoresist layer in a single chamber comprising patterning the antireflection coating and hard mask layer, removing the photoresist and antireflection layers with oxygen, using the patterned polysilicon as a hard mask layer etching an opening in the silicon oxide hard mask layer, the silicon nitride layer and the pad oxide layer, removing the polysilicon hard mask layer with $CF_4/CHF_3$, and etching an anisotropic deep trench in the silicon substrate using the patterned silicon oxide hard mask layer as a mask and an etchant mixture including nitrogen trifluoride that self-cleans the chamber.

5 Claims, 2 Drawing Sheets

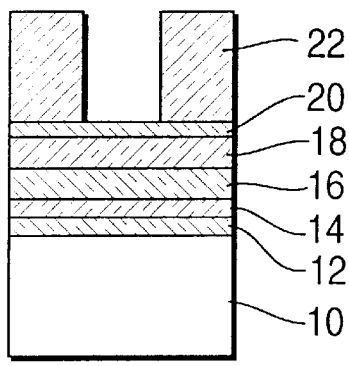
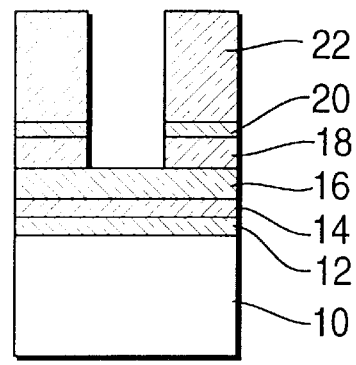
FIG. 1          FIG. 2
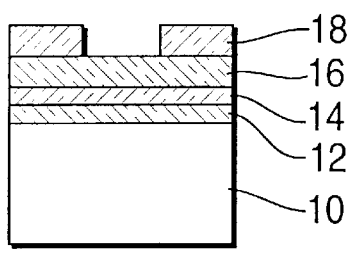
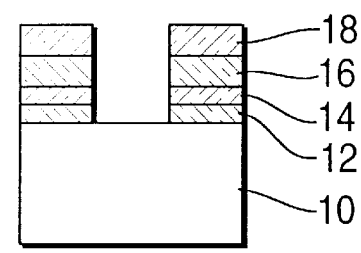
FIG. 3          FIG. 4
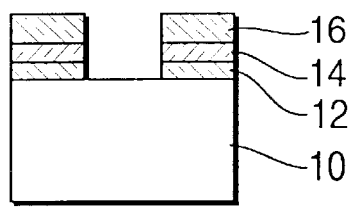
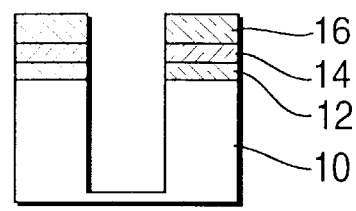
FIG. 5          FIG. 6

PROCESS FOR IN-SITU ETCHING A HARDMASK STACK

This invention relates to a method of etching hardmask stacks for deep trench openings in silicon. More particularly, this invention relates to a method of etching high aspect ratio deep trenches in silicon through a multilayer hard mask stack in a single chamber.

BACKGROUND OF THE DISCLOSURE

Multilayer hard mask stacks used for patterning silicon prior to etching deep, straight walled trenches in the silicon comprise a plurality of layers. One typical hard mask stack, as shown in FIG. 1, comprises in sequence a silicon substrate 10, a thin layer of thermally grown silicon oxide 12, called pad oxide, over the silicon substrate 10; a layer of silicon nitride 14 over the pad silicon oxide layer 12; a layer of silicon oxide hardmask 16, which can be doped (PSG, BPSG) or undoped silicon oxide over the silicon nitride layer 14; a polysilicon hardmask layer 18 over the silicon oxide layer 16; an antireflective coating 20 over the polysilicon layer 18; and a patterned layer of photoresist 22 thereover.

Patterning these different layers requires different etchants and different etch conditions, and thus the substrate and its various layers are presently transferred between up to five different processing chambers. Since processing is carried out in high vacuum plasma chambers, and since changing processing conditions in the chambers is a lengthy process, a tool has been developed that connects several reaction chambers together by means of a central vacuum chamber that connects to each of the processing chambers. A suitable device, such as a robot, picks up a substrate, such as a silicon wafer having the layers thereover as in FIG. 1, and inserts it into a first silicon etch chamber to open the antireflection layer 20 and the polysilicon hard mask layer 18, as shown in FIG. 2.

After processing, the substrate 10 is transferred to the central vacuum chamber and then into a second reaction chamber, known as an ASP or ashing chamber, to remove the remaining photoresist 22 using oxygen. The resultant substrate is shown in FIG. 3 where the polysilicon is a patterned hard mask layer. The substrate 10 is then transferred to a third, cleaning chamber where any remaining photoresist is removed.

The silicon oxide hard mask layer 16, the silicon nitride layer 14 and the thin pad oxide layer 12 are pattern etched in a fourth, dielectric etch chamber, as shown in FIG. 4. The etch stops when the silicon substrate 10 is reached. The polysilicon hard mask layer 18 is then removed, as shown in FIG. 5. A deep trench etch is carried out next using the silicon oxide hard mask 16 as the patterning layer in a fifth etch chamber. The resultant substrate is shown in FIG. 6.

The substrate is never exposed to the atmosphere or to non-vacuum conditions using the above tool, until all of the sequence of steps has been carried out. However, this method requires five chambers and multiple transfers of the silicon substrate by the robot, which can cause damage to the substrate and adds to the time and costs of processing.

The multiple chambers and the multiple steps carried out in the chambers is expensive both in terms of equipment costs and in terms of the time required for processing a single substrate. It would be highly desirable to reduce the amount of equipment required, the time required to process a single substrate, and to eliminate multiple transfers of the substrate.

SUMMARY OF THE INVENTION

We have found that once the photoresist and antireflective layers are patterned, the remaining layers can be etched down to the silicon substrate, and a deep trench etched therein, in a single, high aspect ratio trench etch chamber. This method can be carried out simply by changing the reactant gases and reaction conditions in the chamber. The method not only saves transfer time, but reduces damage and defects that can occur during transfers of the substrate between one chamber and another. Another advantage of this process is that it is self-cleaning. Ths use of fluorine-containing etch gases also serves to remove contaminants from the walls and fixtures of the single etch chamber.

BRIEF DESCRIPTION OF THE DRAWING

FIG. 1 is a cross sectional view of a multilayer mask for a silicon substrate.

FIG. 2 illustrates a silicon substrate pattern etched through an antireflective coating and a hard mask layer.

FIG. 3 illustrates removal of the photoresist and the antireflection layer.

FIG. 4 illustrates pattern etching through a second hard mask layer, a silicon nitride layer and the pad oxide layer.

FIG. 5 illustrates removal of the polysilicon hard mask layer.

FIG. 6 illustrates etching a deep trench in the silicon substrate.

DETAILED DESCRIPTION OF THE INVENTION

Figure 7:
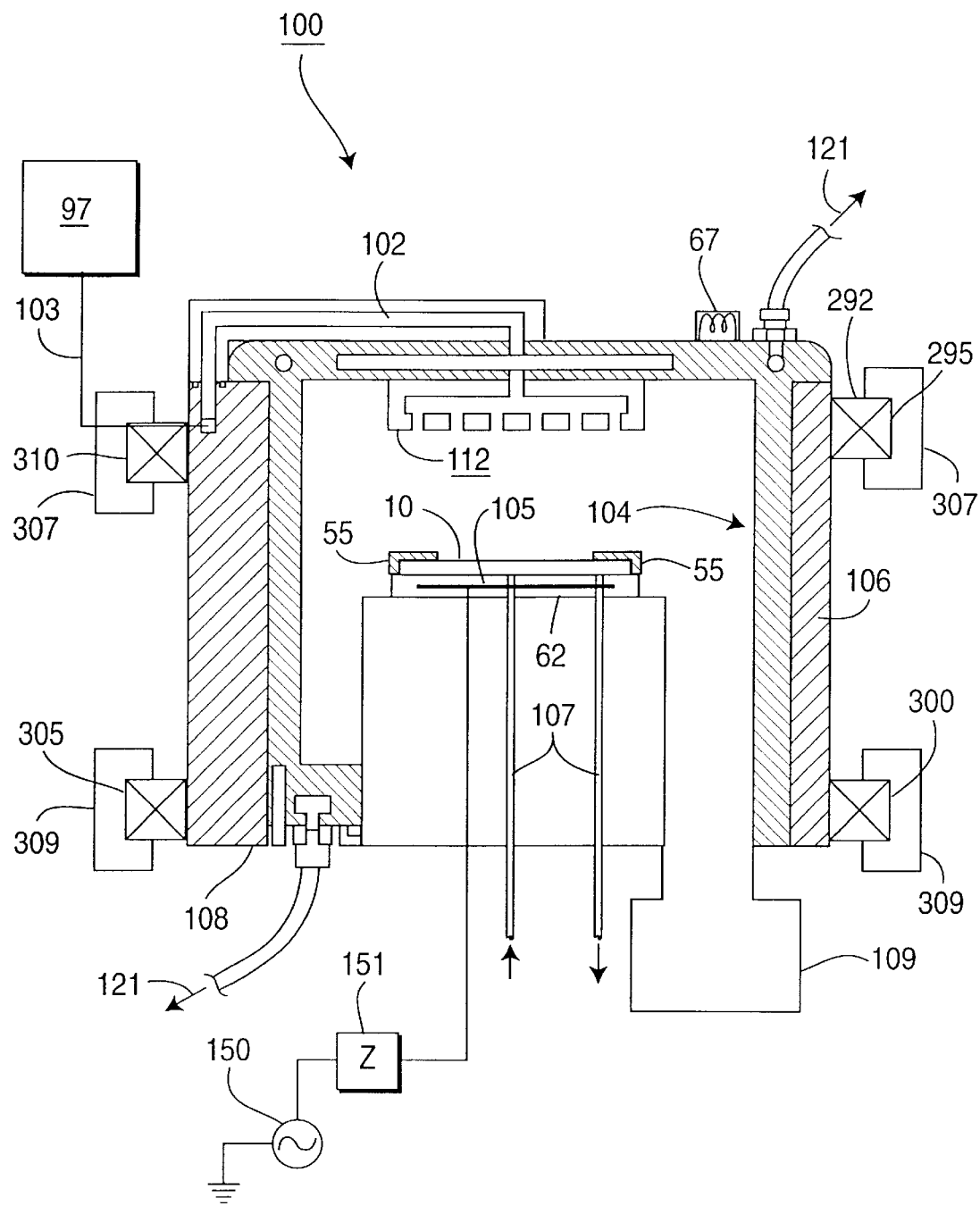
FIG. 7 is a cross sectional view of a high aspect ratio etch chamber suitable for carrying out multiple etch steps.

The method of the invention is also depicted in accordance with FIGS. 1–6, but using a single chamber to carry out the multiple etch steps. The present method etches through an antireflective coating 20 and a polysilicon hard mask layer 18 in a first step using a patterned photoresist layer 22. These layers can be etched using HBr and a passivant as the etchant. The remaining photoresist and antireflective coating are removed by passing oxygen into the same chamber and ashing the organic layers.

Now using the patterned polysilicon hard mask layer 18 as the pattern, the oxide hardmask layer 16, the silicon nitride layer 14 and the pad oxide layer 12 can be etched using a fluorocarbon and/or hydrofluorocarbon etch gas. Suitable etch gases are carbon tetrafluoride and carbon trifluoride. The silicon oxide layer 16 is now the hard mask layer.

A deep trench is then etched in the silicon substrate 10 suitably using an etchant mixture of $HBr/O_2/He/NF_3$ in a weight ratio of about 1:0.2:0.3 in the deep trench etch chamber as described below.

A chamber suitable for carrying out the present process is referred to as a high aspect ratio trench etch chamber (HART) illustrated in FIG. 7.

A chamber 100 includes a lid assembly 102, sidewalls 106 and a bottom wall 108. The chamber 100 is fitted with a liner 104 including a heater 67 for the lid 102. A liner fluid source 121 passes a temperature controlling heat transfer fluid to the chamber walls. The liner 104 also can be heated with a resistant heater (not shown) to prevent deposition of process residues on the chamber walls in addition to the heat transfer fluid passed to the liner 104 via line 121 and regulates the temperature of the walls 106, 108.

A plasma precursor gas source 97 leads to the chamber through a line 103 and is passed to the first electrode 112. A second electrode 105, spaced from and parallel to the first electrode 112, is a substrate support electrode and is connected to a power source 150 via a match network 151. The second electrode 105 is made of a conductive material, such as aluminum, and is at least partially covered by a dielectric 55. This dielectric can be made of a ceramic for example. The second electrode 105 is adapted to be charged to a high power density of at least 10 watts/cm$^2$ such that a substrate having a diameter of about 200 mm can be charged at a power level of at least about 3200 watts; and a substrate having a diameter of about 300 mm can be charged at a power level of at least about 7000 watts.

The dielectric covering 55 for the support electrode 105 permits the support 105 to be charged to a high power density, and provides at least some electric field vectors that are substantially perpendicular to the plane of the substrate 10. These vectors accelerate plasma ions to the substrate support 105 so they can energetically impinge on the support 10. The result is that deeper, better controlled features can be etched in the substrate 10. In addition, a water cooled conductor 62 can be used to further control the temperature of the second electrode 105, which in turn further cools and controls the temperature of the substrate 10 during processing.

An exhaust line 109 connected to vacuum pumps (not shown), removes spent and by-product gases from the chamber 100 and maintains a correct pressure in the chamber of 10 to 1000 millitorr. The exhaust system is capable of pumping about 1600–1800 1/sec.

The space between the first and second electrodes 112, 105 respectively, is the processing zone. By keeping this spacing small, the electric field vectors between the electrodes are relatively strong, and coupling of energy to the gas in the chamber 100 is more efficient. Further, the flow of the plasma precursor gas is more laminar, providing for a more uniform plasma processing.

The chamber 100 also includes a magnetic field generator 292, which can comprise a plurality of magnets 295, 300, 305 and 310. These magnets can be provided with pairs of fluid-containing jackets 307, 309 to improve the temperature uniformity of the magnets. The magnetic field strength can be up to about 175 Gauss.

Thus the chamber 100 and the support substrate 105 can be temperature controlled so as to maintain a uniform temperature for the substrate 10 on its support during processing, on the order of about 50–90° C. Further, high RF power levels and magnetic fields applied to the chamber can be sustained for long periods of time. This ensures high etch rates for high aspect ratio openings.

In order to maintain the substrate temperature at a desired level, i.e., from –40 to 240° C., a backside flow of helium in lines 107 can be used in known manner. Preferably, the substrate support is divided into two zones, an inner zone and an outer zone (not shown). The inner zone can have a gas pressure of 10–16 Torr and the outer zone can have a gas pressure of about 20 Torr to ensure a uniform temperature across the substrate support 105.

A deep trench was etched in a silicon substrate using an etchant mixture of 100 sccm of HBr, 18 sccm of a mixture of oxygen in helium, and 36 sccm of nitrogen trifluoride as the etchant mixture in a chamber 100 as described above having a volume of about 25 liters. The chamber was operated so that the substrate electrode support 105 was maintained at a temperature of 50–60° C.; the backside helium pressure was maintained at 16–20 Torr; the RF power was applied at 3500 Watts; and a magnetic field strength was maintained at about 100 Gauss. The resultant trench had an opening size of 0.1 micron and a depth of 8.03 microns for an aspect ratio of about 57, a straight walled profile and an etch rate of 0.8 micron per minute.

Thus the present method etches an opening from the layers of FIG. 1 to that of FIG. 6 in a single chamber. This eliminates multiple transfers of the substrate from one chamber to another, improving throughput and reducing the costs of supplying multiple chambers; improves yields by reducing the accidental damage due to a plurality of transfers from one chamber to another; and reduces the processing time required for carrying out multiple processing steps over that of transferring to and from various processing chambers.

Although the method of the invention has been described in terms of particular layers and particular etchants and etch conditions, and a particular etch chamber, one skilled in the art can make substitutions without departing from the spirit of the invention, and they are meant to be included herein. The scope of the invention is only meant to be limited by the scope of the appended claims.

We claim:

1. A method of etching a high aspect ratio, deep trench opening in a silicon substrate covered with a multilayer stack comprising, in sequence, a patterned photoresist layer, an antireflection coating layer, a polysilicon hard mask layer, a silicon oxide hard mask layer, a silicon nitride layer and a pad oxide layer comprising a) etching an opening in the antireflection and polysilicon hard mask layers through the photoresist mask layer;

b) removing the photoresist and antireflection layers;

c) pattern etching the silicon oxide hard mask layer, the silicon nitride layer and the pad oxide layer, d) etching away the polysilicon hard mask layer, and e) etching a high aspect ratio deep trench in the silicon substrate, wherein steps a) through e) are carried out in a single high aspect ratio trench etch chamber.

2. A method according to claim 1 wherein the etch mixture for step a) comprises hydrogen bromide and a passivant.

3. A method according to claim 1 wherein the photoresist and antireflection layers are removed with oxygen.

4. A method according to claim 1 wherein the etch mixture for step c) comprises CF4 and CHF3.

5. A method according to claim 1 wherein the etch mixture for step e) is HBr, an oxygen/helium mixture and nitrogen trifluoride.

* * * * *